United States Patent [19]

Bonnie et al.

[11] 4,251,319

[45] Feb. 17, 1981

[54] BUBBLE MEMORY CHIP AND METHOD FOR MANUFACTURE

[75] Inventors: G. Patrick Bonnie, Richfield; Steven C. Schuster, White Bear Lake, both of Minn.

[73] Assignee: Control Data Corporation, Minneapolis, Minn.

[21] Appl. No.: 106,305

[22] Filed: Dec. 21, 1979

Related U.S. Application Data

[62] Division of Ser. No. 23,995, Mar. 27, 1979.

[51] Int. Cl.[3] ........................ B44C 1/22; G11C 19/08; B05D 5/12

[52] U.S. Cl. .................................... 156/656; 156/657; 156/659.1; 156/904; 427/96; 427/259; 427/261; 427/282; 365/37; 365/39

[58] Field of Search .................... 365/37, 39; 156/656, 156/657, 659, 904; 96/361; 427/126.2, 126.4, 259, 261, 282, 96, 123

[56] References Cited

U.S. PATENT DOCUMENTS

| | | | |
|---|---|---|---|
| 3,485,665 | 12/1969 | De Angelo et al. | 156/657 |
| 3,626,589 | 12/1969 | Vincent et al. | 156/657 |
| 3,808,068 | 4/1974 | Johnson et al. | 156/655 |

OTHER PUBLICATIONS

Reekstin et al., Fabrication of Large Bubble Circuits, IEEE Transactions on Magnetics, vol. Mag-9, No. 3, Sep. 1973.

Rose, Planar Processing for Magnetic Bubble Device, IEEE Transactions on Magnetics, vol. Mag-12, No. 6, Nov. 1976, pp. 618-621.

*Primary Examiner*—Ronald H. Smith
*Assistant Examiner*—Richard Bueker
*Attorney, Agent, or Firm*—William J. McGinnis; Joseph A. Genovese

[57] ABSTRACT

A bubble memory chip is manufactured using the following processing steps:

a first dielectric insulation layer is deposited on the epitaxial garnet substrate, next, a comparatively thicker layer of a second dielectric insulator is deposited on the surface of the first layer of dielectric insulation, next, the reverse of the desired conductor image is printed on the surface of the second layer of dielectric insulator using a resist material such as a photoresist, next, a straight wall etching process is used to achieve a straight wall etching of the second layer of dielectric insulation but not affecting the first layer of dielectric insulation, next, the selected conductor material is deposited into the exposed groove from the previous etching process and over any remaining resist material such as a photoresist, next, a resist material is applied over the resulting conducting surface from the previous step, next, a course featured pattern is printed over the desired conductor regions leaving exposed the extensive surface area of the chip where no finished conductor features will be present, next, all exposed conductor is etched off using chemical processes, and finally, the last step is a stripping of the photoresist including lift-off of remaining unused conductor material to leave a planar surface.

3 Claims, 6 Drawing Figures

BUBBLE MEMORY CHIP AND METHOD FOR MANUFACTURE

This is a division of application Ser. No. 23,995, filed Mar. 27, 1979.

BACKGROUND OF THE INVENTION

This invention relates to fabrication of bubble memory chip devices. In particular, this invention relates to the production of the fine conductor pattern on the garnet substrate prior to the addition of further permalloy and dielectric elements.

Conventional bubble memory circuits are fabricated in a non-planar process in which the permalloy elements cross over the conductor elements in the active areas of the chip. These non-planar devices are usually limited in performance by weak margins or limits of performance in the areas where step coverage of conductors by permalloy elements exists. One solution to this problem of marginal performance would be a process in which the permalloy elements are fabricated on a planar surface having buried conductors therein. It is one of the objects of this invention to produce a bubble memory chip and method for fabrication which would have buried conductors on which permalloy elements would be fabricated. Among the advantages of such an arrangement would be the linear flux continuity of the permalloy elements. Because there would be no discontinuities at the steps of the permalloy elements there is a reduced need for drive and power requirements and a corresponding increase in production yield and operating margin characteristics. Also, all portions of each permalloy element would be spaced at the uniform optimum distance from the garnet substrate thereby reducing error rates and increasing performance margins. A further advantage would be obtained in the fabrication steps involving the permalloy elements because a higher resolution and greater density could be obtained in these elements without the step features. Also, the proper formation of steps in conductive elements requires careful control of the edges at the step to provide proper conductor thickness and conductivity. By eliminating steps the conductor conductivity would be optimized. Similarly, the planar conductors uniformly encased in the dielectric media would result in more uniform magnetic fields than those achieved using step features.

Several planar processes have been developed for semiconductor devices. These processes involve the so called lift-off techniques in which either the conductor or dielectric is back filled to bring the surface to a planar level. However the materials used in semiconductor manufacture are not appropriate for bubble memory device manufacture because the materials used in the lift-off process are dielectric rather than conductive and because of the comparatively different surface features in the bubble memory design.

An excellent paper discussing this subject is that by J. P. Reecksten and R. Kowalchuk found in IEEE Transactions on Magnetics, Volume MAG-9, Number 3, September 1973, entitled "Fabrication of Large Bubble Circuits" at page 465. The various processes described suffer from a variety of problems. Stencil deposition requires either double masking or metal/resist lift-off. The fine geometry and unique topography of bubble circuits makes this difficult to implement. Dielectric lift-off is not compatible with the high temperature deposition techniques used in bubble memory fabrication. Electroless stencil techniques demand thin, buried, catalytic layers or an additional masking step requiring close registration. All techniques requiring more than a single registration process step becomes significantly more complicated because the various registration layers have to be aligned with one another as well as features involved. The invention described in the present application is a development based on the stencil etch technique.

SUMMARY OF THE INVENTION

The present invention is a combination of fabrication steps in the formation of a conductor layer on a garnet substrate for bubble memory chips. The resulting product is a garnet substrate having a conductor layer formed thereon and having a planar surface suitable for desposition of permalloy elements according to the desired bubble memory pattern.

Initially, the epitaxial garnet substrate has a two layer dielectric deposited thereon. The first layer of dielectric has a greater resistance to the etching process to be used than the second layer of dielectric material. Thus the first layer of dielectric material serves as a stop-off or a stop guard for the stencil etch processing step. Thus, the first layer of dielectric insulation provides a buried strain-relief layer of predictable and predetermined thickness.

A significant feature of bubble memory chips is that such a large portion of the garnet surface is not covered with conductor, or to say it in another way, only a very small proportion of the total area of the garnet substrate is covered by conductor. Thus, one of the significant steps in the process is the use of a crude or coarse featured, minimally registered pattern in an additional masking step to aid with the lift-off step in the process. Because of the large unfeatured areas of the bubble memory chip, there would be no entry point for the resist stripper and the lift-off would be difficult and perhaps incomplete at best. Thus the coarse masking step and the following etching steps reduced the final resist stripping step to only more essential features of the bubble memory chip.

This approach has advantages in that the processing steps are relatively straightforward in execution and do not require advanced technology. The additional masking step, because it is only applied in a coarse fashion, does not require the care or processing technique required for close registration and high resolution. Because of the fact that no dielectric lift-off step is involved in this technique, there is no problem of compatibility with high temperature dielectric deposition steps. The final product results in a truly planar surface of the type desired and which is compatible with fine line features being developed.

IN THE FIGURES

DESCRIPTION OF THE PREFERRED EMBODIMENTS

Figure 1:
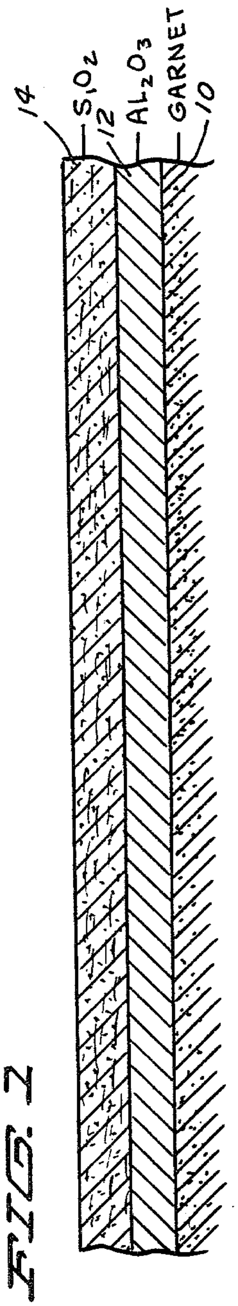
FIG. 1 shows the first stages of the process in which the first and second dielectric layers are deposited on the garnet substrate according to the invention.

Referring now to FIG. 1, an initial substrate 10 of epitaxial garnet of the type conventionally used for bubble memory chips is shown in which a first dielectric layer 12 has been deposited in a conventional fashion. This layer is a dielectric insulator such as a metal oxide and it is deposited to a thickness of approximately 2000 angstroms. The layers of materials shown in the figures are not shown to scale. A second layer 14 of another dielectric insulator is shown deposited on the first layer 12 of dielectric insulator. This second layer of dielectric material is deposited to a greater thickness than the first layer and may for example be on the order of 5000 angstroms thick or approximately $2\frac{1}{2}$ times as thick as the first layer of dielectric material. The material is chosen to be a material more easily etched than the first layer of of dielectric material and may for example be silicon dioxide. Other materials and relationships between the first and second dielectric layers exist. For example, silicon dioxide and magnesium oxide may be used as the appropriate dielectric layers. These materials are selected so that they may be vacuum deposited and differentially etched, using a mass spectrometer to detect the end point of ion etching requires only a different atomic weight of the cation.

Figure 2:
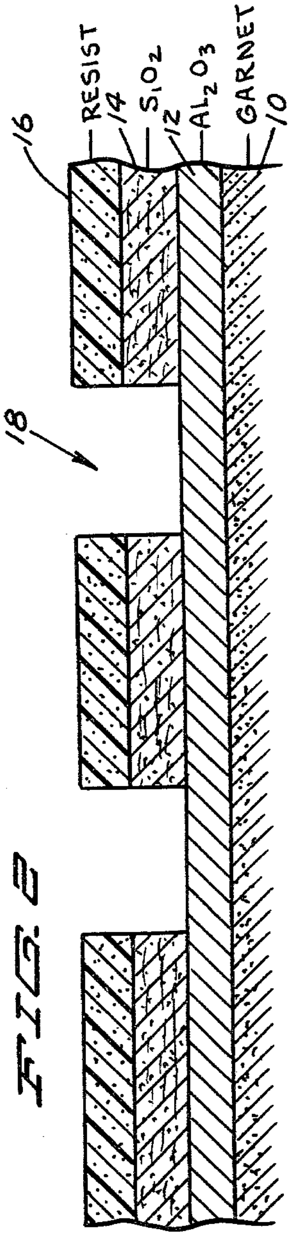
FIG. 2 shows a further processing stage according to the invention in which a reverse conductor image resist material has been imprinted on the surface shown in FIG. 1 and then straight-wall etched.

Referring now to FIG. 2 showing a further processing step from that shown in FIG. 1 shows that a resist layer 16 material of any common and appropriate type such as a positive photoresist or metal resist is applied on the surface of the second dielectric layer 14. For example a metal or bismuth oxide resist may be used. This material would be used because of its temperature tolerance and ability to withstand further processing steps. This resist is applied to a thickness of approximately one to two micrometers. This photoresist is applied in the reverse image of the desired conductor pattern. FIG. 2 then shows the further processing step having been completed in which the second layer 14 of dielectric insulation material has been straight wall etched to expose the surface of the first layer 12 of dielectric insulator material. The straight wall etching processes may for example be plasma or ion beam etching and the first layer 12 of dielectric material acts as a stopping barrier or detectable endpoint where the first layer 14 of dielectric material is more easily etched.

Figure 3:
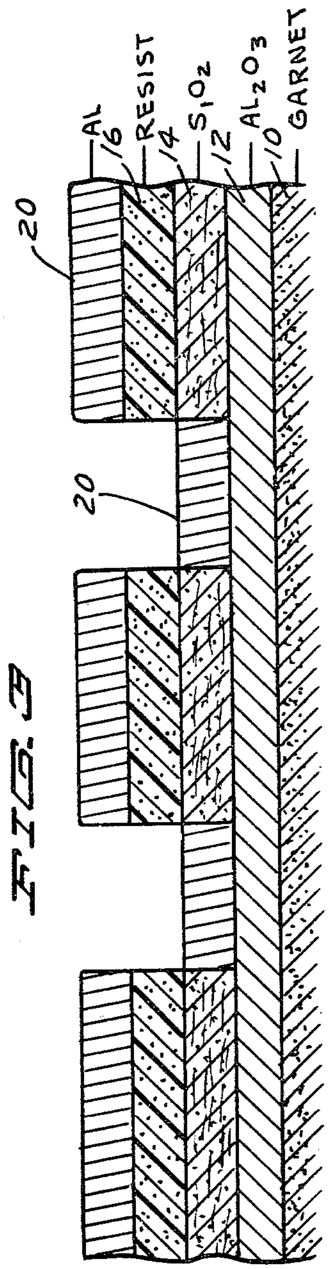
FIG. 3 shows a further stage in the process according to the present invention in which the stage represented in FIG. 2 has had a conductor layer deposited into the exposed groove and over all of the remaining resist material.

Referring now to FIG. 3, a further step from that shown in FIG. 2 has occurred in which a layer of metal 20 has been applied in the grooves 18 etched in the previous processing step and also covering the resist material 16. This metal conductor material is deposited to a thickness of approximately 5000 angstroms and may consist of metals such as aluminum or gold. Once again, the thickness of the conductor layer is intentionally not shown to scale in FIG. 3 to more clearly illustrate the invention and to more clearly emphasize the fact that this invention is not to be limited by exact thicknesses or dimensions of materials. The conductor may be an aluminum-copper alloy or gold or any highly conductive metal resistant to electromigration.

Figure 4:
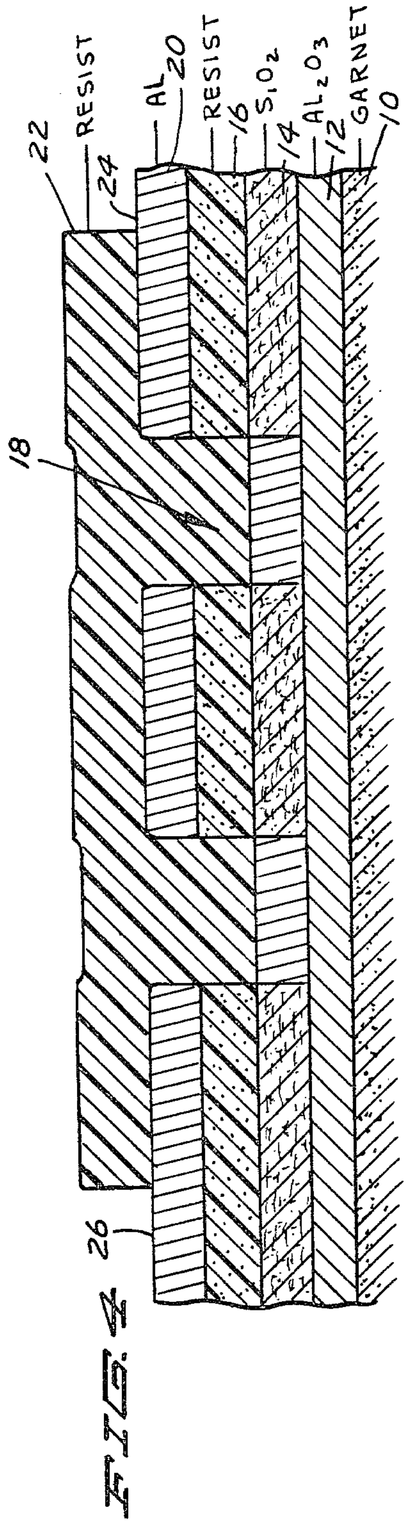
FIG. 4 shows the stage in processing according to the invention after that shown in FIG. 3 in which a coarse featured block pattern resist material is printed over conductor regions in a further resist applied to the chip.

Referring now to FIG. 4, a resist material layer 22 is applied over all of the features that have been produced through the processing stages shown in FIG. 3 to cover all exposed sections of the conductor material 20 in regions where grooves 18 exist which represent the final desired conductor pattern to remain after all processing is completed. Material layer 22 may be a photoresist. This resist material layer 22 is defined in an extremely coarse featured pattern over these conductor regions but not over the remaining areas of the chip where no conductor is to exist when processing according to the present invention is complete. Thus in FIG. 4, areas 24 and 26 of conductor 20 are shown uncovered by resist layer 22 to represent the approximately 95 percent of the final chip in which there will be no conductor pattern according to this processing method. Thus, resist layer 22 is applied to generally cover in a coarse fashion areas where a conductor is to remain after all processing is complete.

Figure 5:
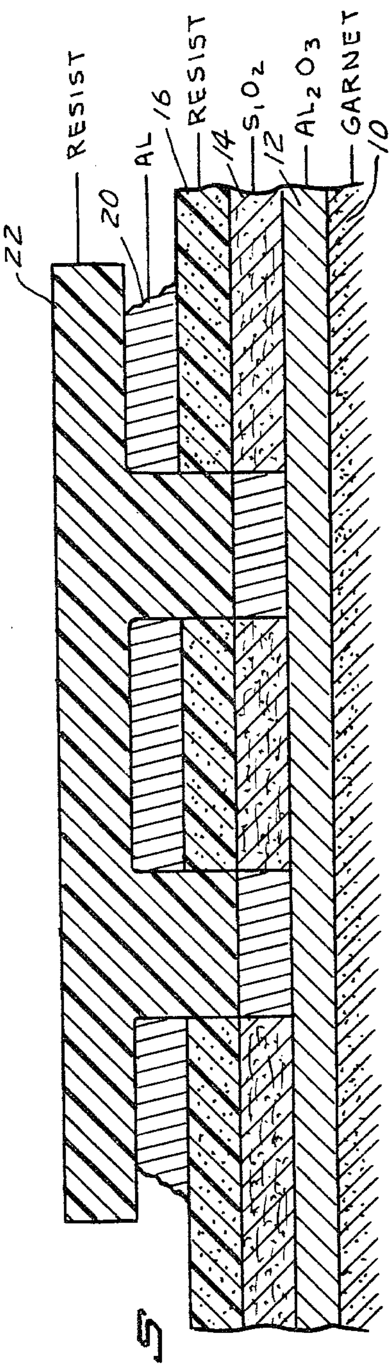
FIG. 5 shows the next stage of processing after FIG. 4 according to the invention in which the exposed conductor material is etched off using a chemical process.

Referring now to FIG. 5, the processing step following the stage reached in FIG. 4 is shown in which a wet chemical or acid etch technique is used to remove all of the exposed conductor material 20 uncovered by resist layer 22. This acid etching step is not critical as to detail since no final feature remaining in the finished product is etched or created at this stage of processing. The advantage is that the remaining resist 22 covers in a coarse fashion conductor areas comprising approximately five percent, more or less, of the finished chip.

Figure 6:
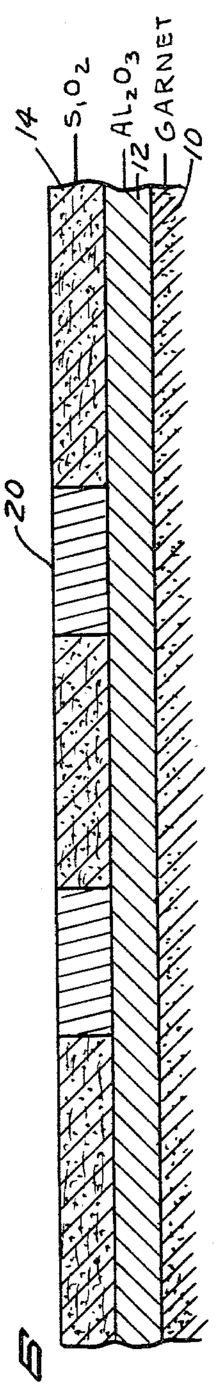
FIG. 6 shows the final step according to the present invention after the stage shown in FIG. 5 in which the photoresist is stripped and the remaining unused conductor material is lifted off leaving a planar surface for further processing.

Referring now to FIG. 6, all of the final processing steps have been completed and the finished product is shown. These final processes consist of stripping the photoresist by an appropriate method, lifting off any unused conductor 20, and stripping any remaining resist covered by the conductor 20. Thus all of the resist layer 22 and the resist 16 is removed in the final processing steps together with the stripping off of the unused portions of conductor 20. Thus, FIG. 6 shows a finished product consisting of a garnet substrate 10, a uniform planar layer of a first dielectric and a second layer of dielectric 14 having conductor 20 formed into appropriate conductor patterns and buried in the dielectric 14 so that the resulting product has a planar uniform surface over both the dielectric 14 and the conductor material 20.

What is claimed is:

1. A method for forming a bubble memory chip comprising the steps of depositing a first layer of dielectric insulator on a garnet substrate, depositing a second layer of dielectric insulator on the surface formed of the first dielectric insulator, the second dielectric insulator being of a material which will be etched by a particular process which will not affect the first dielectric insulation layer, applying an initial resist pattern in the reverse image of the predetermined desired conductor pattern to be formed, straight wall etching the second dielectric layer according to the pattern formed by the resist material by not etching the first dielectric insulator layer of material, applying a conductor material by a deposition process into the grooves formed by the previous etching process and on the surface of the remaining resist material, applying a coarse featured resist material over the comparatively small portion of the chip corresponding to approximately five percent more or less of the surface area of the finished chip which is desired to be covered by a conductor pattern at the conclusion of processing an in coarse and not exact registration with the conductor features to be preserved but not over any comparatively larger features of the chip which are to have no conductor pattern, etching by chemical means all of the conductor material not covered by the coarse resist material applied in the previous step, and stripping away the coarse resist material left from the previous step and lifting off unused conductor material along with said initial photoresist to leave a planar surface comprised of conductor material formed in the pattern of conductor elements at a surface coplanar with the surface of the second dielectric insulator material.

2. The method of claim 1 in which the coarse resist material is a photoresist.

3. The method of claim 1 in which the initial resist material is bismuth oxide.

* * * * *